United States Patent
Bao et al.

(10) Patent No.: US 8,344,787 B2
(45) Date of Patent: Jan. 1, 2013

(54) METHOD AND ARRANGEMENT FOR A LINEAR MIXER

(75) Inventors: Mingquan Bao, Västra Frölunda (SE); Yinggang Li, Askim (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 274 days.

(21) Appl. No.: 12/520,824

(22) PCT Filed: Dec. 22, 2006

(86) PCT No.: PCT/SE2006/050624
§ 371 (c)(1), (2), (4) Date: Mar. 1, 2010

(87) PCT Pub. No.: WO2008/079067
PCT Pub. Date: Jul. 3, 2008

(65) Prior Publication Data
US 2010/0141325 A1    Jun. 10, 2010

(51) Int. Cl.
*G06G 7/12* (2006.01)

(52) U.S. Cl. .......... 327/355; 327/359; 455/326
(58) Field of Classification Search .......... 327/355, 327/356, 359, 361; 455/326, 333
See application file for complete search history.

(56) References Cited

U.S. PATENT DOCUMENTS

| | | | | |
|---|---|---|---|---|
| 6,057,714 | A * | 5/2000 | Andrys et al. | 327/105 |
| 6,335,651 | B1 | 1/2002 | Fayyaz | |
| 6,393,260 | B1 | 5/2002 | Murtojarvi | |
| 2003/0128071 | A1 * | 7/2003 | Nguyen et al. | 330/254 |
| 2004/0043742 | A1 | 3/2004 | Beumer | |

* cited by examiner

*Primary Examiner* — Lincoln Donovan
*Assistant Examiner* — Shikha Goyal

(57) ABSTRACT

A combination mixer arrangement comprising a first mixer and a second mixer coupled in parallel between first and second input ports and an output port. The mixers are arranged to be driven simultaneously by an input signal provided at the second input port. They are de-coupled, so a bias voltage applied at the first input port provides dc bias simultaneously for the mixers to enable gain expansion of the first mixer responsive to an increase in said input signal and thereby an improved linearity for the combination mixer arrangement.

9 Claims, 6 Drawing Sheets

METHOD AND ARRANGEMENT FOR A LINEAR MIXER

TECHNICAL FIELD

The present invention relates to mixer circuits in general, specifically to highly linear mixer circuits.

BACKGROUND

Mixers play an indispensable role in communication systems as frequency-translation devices for both down- and up-conversion. At microwave frequencies, monolithically integrated mixers using a single or multiple transistors exist in various semiconductor technologies such as Si bipolar, CMOS, SiGe HBT, GaAs FET, GaAs p-HEMT. Various circuit topologies are also in evidence, resulting in both passive and active type of mixers.

In addition to relatively moderate demand for conversion gain, high linearity and low noise figure are often required for these mixers. However, a common problem with existing mixer topologies is the difficulty to offer a combination of high linearity and low noise while still providing positive conversion gain.

Consequently, there is a need for mixer topologies that enable simultaneously high linearity, low noise and positive gain.

SUMMARY

An object of the present invention is to provide a new mixer circuit.

Another object of the present invention is to provide a highly linear mixer circuit.

A further object is to provide a highly linear mixer with low noise.

An even further object is to provide a highly linear, low noise mixer with positive conversion gain.

These and other objects are achieved according to the set of claims.

According to a basic aspect, an embodiment of a mixer 1 of the present invention discloses a combination mixer 1 comprising two mixers M1, M2 coupled in parallel between first and second input ports IN1, IN2 and an output port OUT. The mixers M1, M2 are dc-coupled and arranged to be driven simultaneously by an input signal at the second input port IN2. In addition, a bias voltage $V_{bias}$ is provided at the first input port IN1, thus enabling gain expansion of the first mixer M1 in response to an increase in the input signal. Consequently, the combined mixer arrangement is capable to offer improved linearity.

Advantages of the present invention include:
An improved mixer for up- and down conversion
A mixer with improved linearity
A mixer with reduced noise and positive gain

BRIEF DESCRIPTION OF THE DRAWINGS

The invention, together with further objects and advantages thereof, may best be understood by referring to the following description taken together with the accompanying drawings, in which.

DETAILED DESCRIPTION

The present invention will be described with reference to a mixer topology, which is implemented as fully integrated on a semiconductor chip in, for instance, Si or GaAs technology. However, it is evident that use of discrete components or a hybrid of integrated circuits (IC) and discrete components can be used to implement the topology. Further, although the description mainly concerns down-conversion the same topology can be equally well used for up-conversion as well.

To provide a more in depth understanding of the difficulties with known mixer topologies, a selection of mixer topologies will be described and discussed below.

Figure 1:
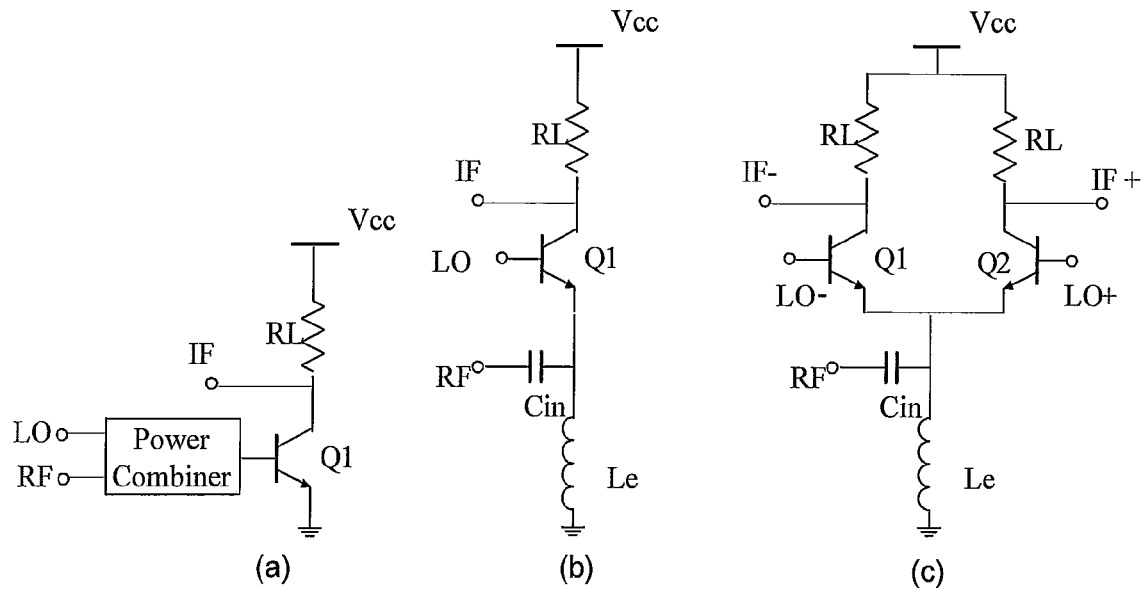
FIGS. 1a-1c illustrate various known trans-conductance mixer topologies.

One known topology is the so-called trans-conductance mixer, as shown in FIG. 1, in which a frequency shift is realized by utilizing the nonlinear characteristic between collector current and base-emitter voltage. As shown in FIG. 1(a), both radio frequency (RF) and local oscillator (LO) signals can be applied to the base of transistor Q1 via a power combiner that often consumes large chip area. Alternatively, RF and LO signals can be applied to the emitter and the base, respectively, as shown in FIG. 1(b), where Le provides an AC chock. A single-balanced version of the trans-conductance mixer is shown in FIG. 1(c).

Figure 2:
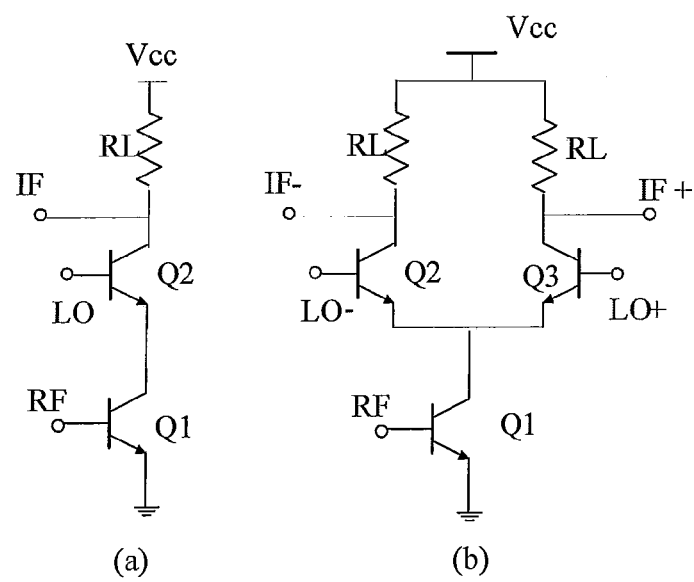
FIG. 2 illustrates a known switching mixer topology.

Another widely deployed topology of active mixers is the so-called switching-type mixer [1]. An example is shown in FIG. 2(a), where transistor Q1 transfers the RF voltage signal applied at the input terminal RF into a current signal that is switched on-and-off by the transistor Q2 at the frequency of LO. When using a differential LO to switch an emitter-coupled pair, as shown in FIG. 2(b), the so-called single-balanced Gilbert mixer is obtained.

The linearity performance of the existing active mixer topologies mentioned above varies and often suffers from inadequacies in one way or another. In general, there is strong demand for improving mixer linearity so that it does not become a bottleneck in the design of transmitter and receiver chain in terms of linearity.

Figure 3:
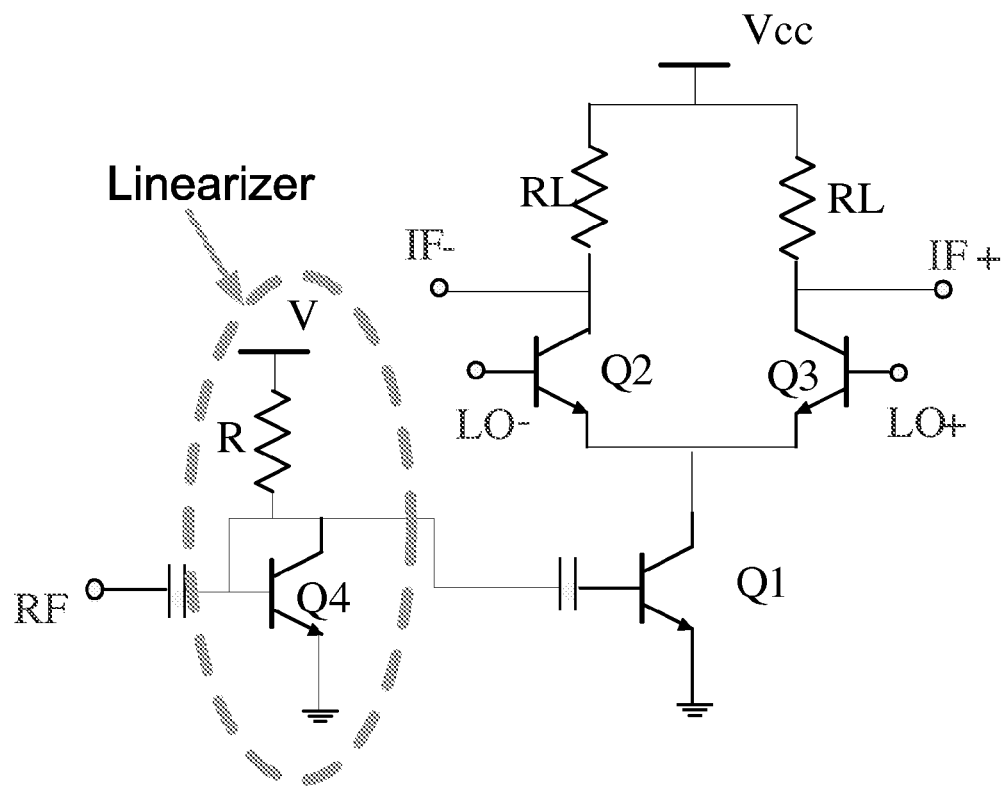
FIG. 3 illustrates a known mixer topology with pre-distortion (i.e., linearizer)

One known approach to improve the linearity of mixer circuits is to utilize a large DC current in the previously described Gilbert mixer, which unfortunately adds noise and consumes large dc power. Another approach is to use a pre-distortion (so-called linearizer), which is best described as a nonlinear circuit with gain-expansion to compensate the mixer's gain compression, as shown in FIG. 3. However, the linearizer introduces extra insertion loss and noise.

Figure 4:
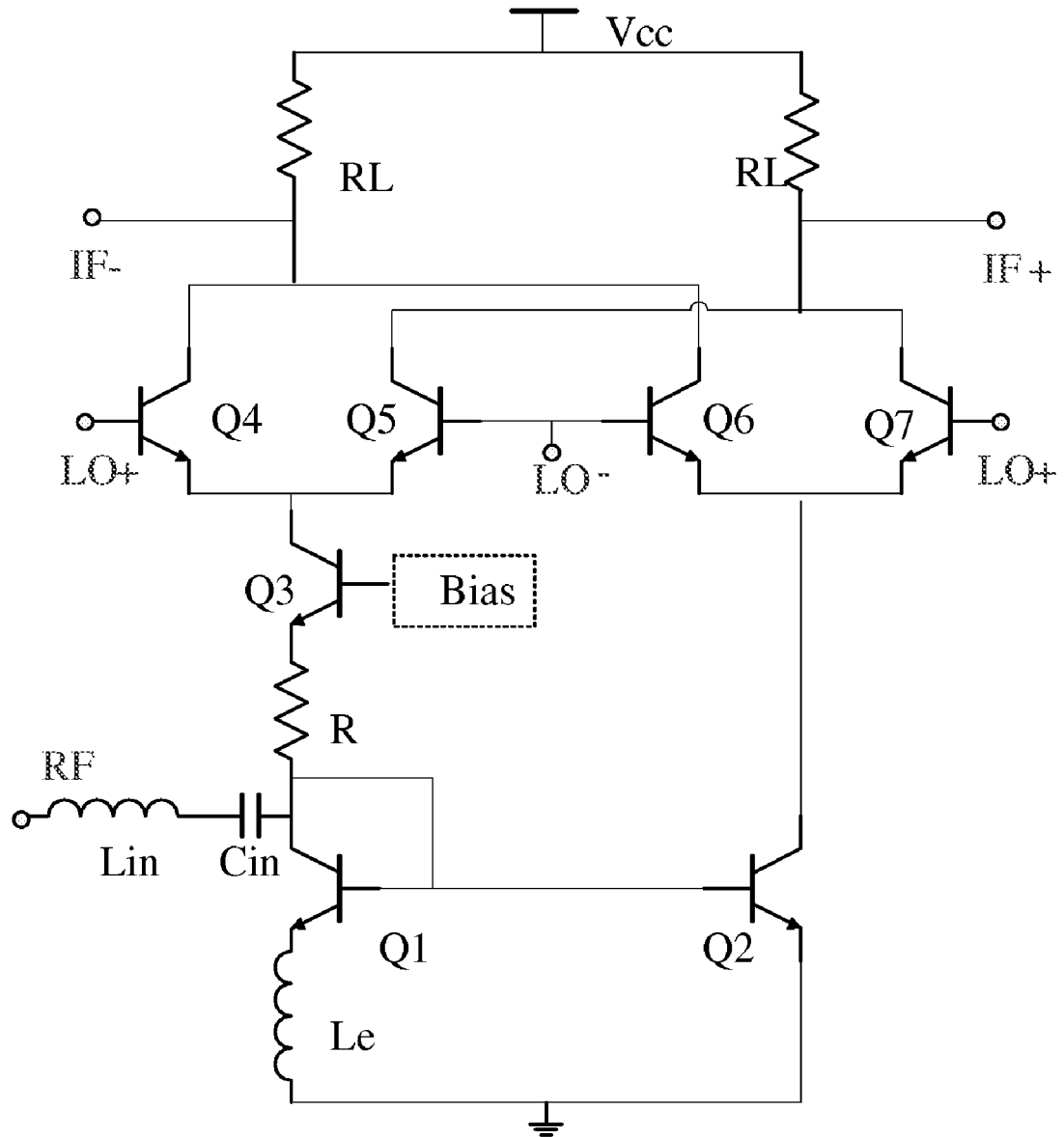
FIG. 4 illustrates a further known mixer topology (i.e., the so-called micromixer)

A third known approach is to apply a so-called micromixer topology, as shown in FIG. 4, [4]. Transistors Q1, Q2 and Q3 form a trans-conductance stage and convert a single-ended RF voltage signal into differential collector currents of Q3 and Q2. Transistor Q3, configured in common-base, and transistor Q2, configured in common-emitter, are two inevitable components in this topology. Such a trans-conductance stage has better linearity than the emitter-coupled pair, which is used in a double-balanced Gilbert mixer. However, the micromixer has a drawback of high noise figure and low conversion gain.

One object of the present invention is therefore to provide a mixer topology with improved linearity performance while at the same time ensuring low noise and positive gain.

A general embodiment of a mixer topology according to the present invention is described with reference to FIG. 5. The embodiment discloses a combination mixer 1 with first and second input ports IN1, IN2 for receiving input signals, and an output port OUT for providing output signals. Further, the mixer includes two mixer units M1, M2 that are coupled in parallel between said input IN1, IN2, and output OUT ports. The two mixers are dc-coupled and designed to be driven by a single input signal applied at the second input port IN2. In addition, the first input port IN1 is adapted to receive a bias voltage $V_{bias}$.

Figure 5:
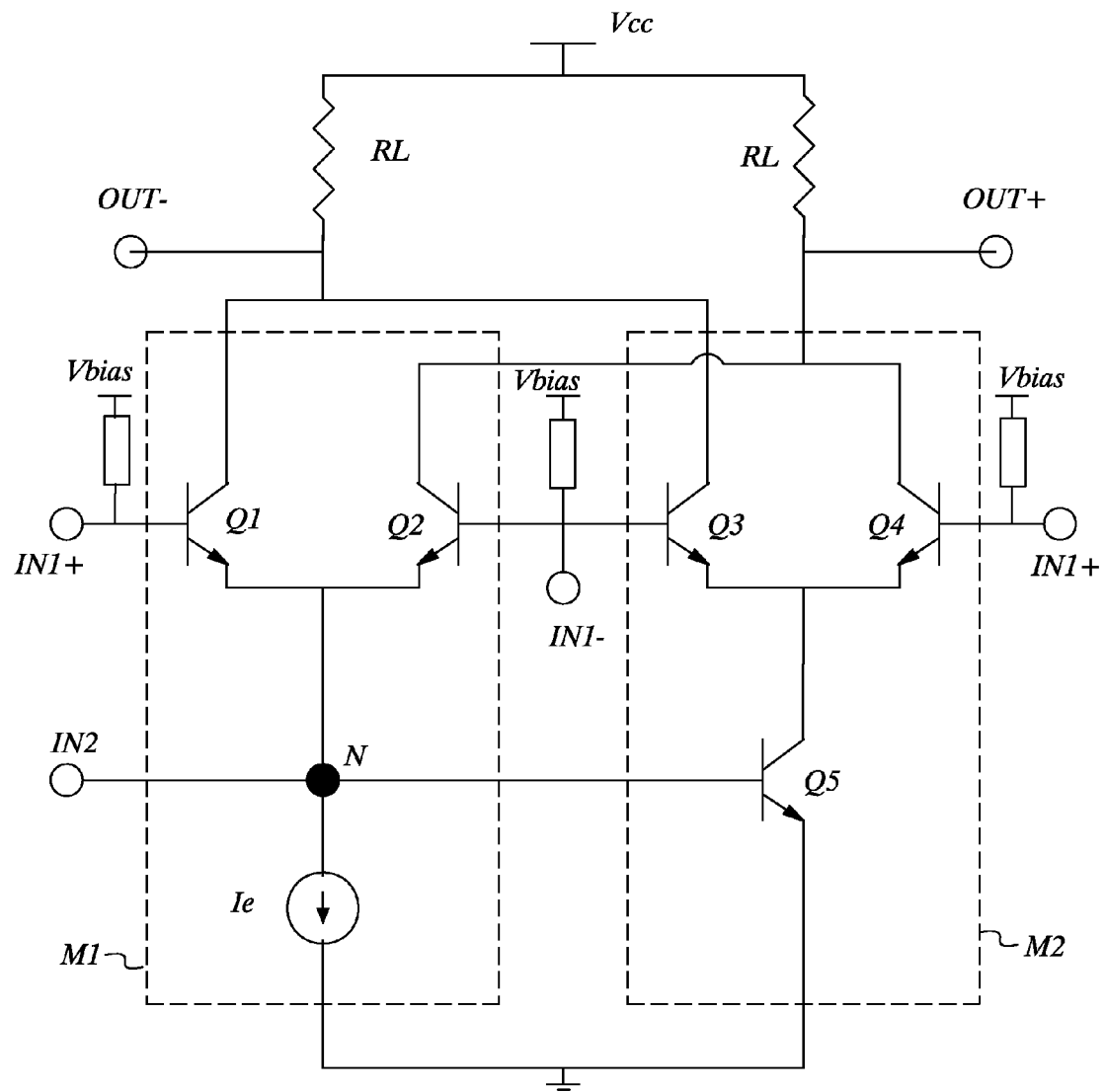
FIG. 5 illustrates an embodiment of the present invention.

According to the embodiment of the mixer topology in the present invention, the proposed mixer is composed of a single-balanced trans-conductance mixer M1 and a single-balanced Gilbert mixer M2, as shown in FIG. 5. The bias voltage $V_{bias}$ provides dc bias simultaneously to both M1 and M2 through their direct dc coupling. The subtleness of the combination lies on the observation that such a special bias arrangement results in gain expansion for mixer M1 in response to an increase in the provided input RF signal at the second input terminal IN2. Thereby the linear region of the whole mixer is extended.

The trans-conductance mixer M1 comprises a pair of transistors Q1, Q2, where the first transistor Q1 is connected to a first terminal IN1+ of the first input terminal IN1 and to a first output terminal OUT− of the output port OUT. The second transistor Q2 is connected to a second terminal IN− of the first input port IN1 and to a second terminal OUT+ of the output port OUT. In addition, the two transistors Q1, Q2 are coupled with each other and with a node N, which in turn is connected to the second input port IN2 and via a current source $I_e$ to ground.

The Gilbert mixer M2 comprises three transistors Q3, Q4, Q5. The third transistor Q3 is coupled with the first output terminal OUT−, and to the second input terminal IN1− of the first input port IN1. The fourth transistor Q4 is coupled with the second output terminal OUT+ and to the first terminal IN1+ of the first input port IN1. In addition, the third and fourth transistors Q3, Q4 are coupled to each other and to the fifth transistor Q5, which is also coupled with said second input port IN2 via the node N and to the ground.

According to a specific embodiment, the first input port IN1 can comprise a local oscillator input port for receiving differential input signals of the local oscillator. In a corresponding manner, the second input terminal IN2 can comprise a RF input for receiving a single-ended RF input signal.

The single-ended RF signal drives the above-mentioned two mixers simultaneously. The outputs of both mixers M1, M2 are connected in parallel, e.g., for the case of bipolar transistors the collectors of first and second transistors Q1, Q3 are connected, and so are the collectors of second and fourth transistors Q2, Q4.

The base of transistor Q5 in mixer M2 is connected with the emitter of the first and second transistors Q1 and Q2 in the trans-conductance mixer. Therefore, the dc voltage bias at the base of Q5 is determined by the voltage bias $V_{bias}$ at the base of first and second transistors Q1, Q2, and the base-emitter dc voltage of those transistors Q1, Q2.

Figure 6:
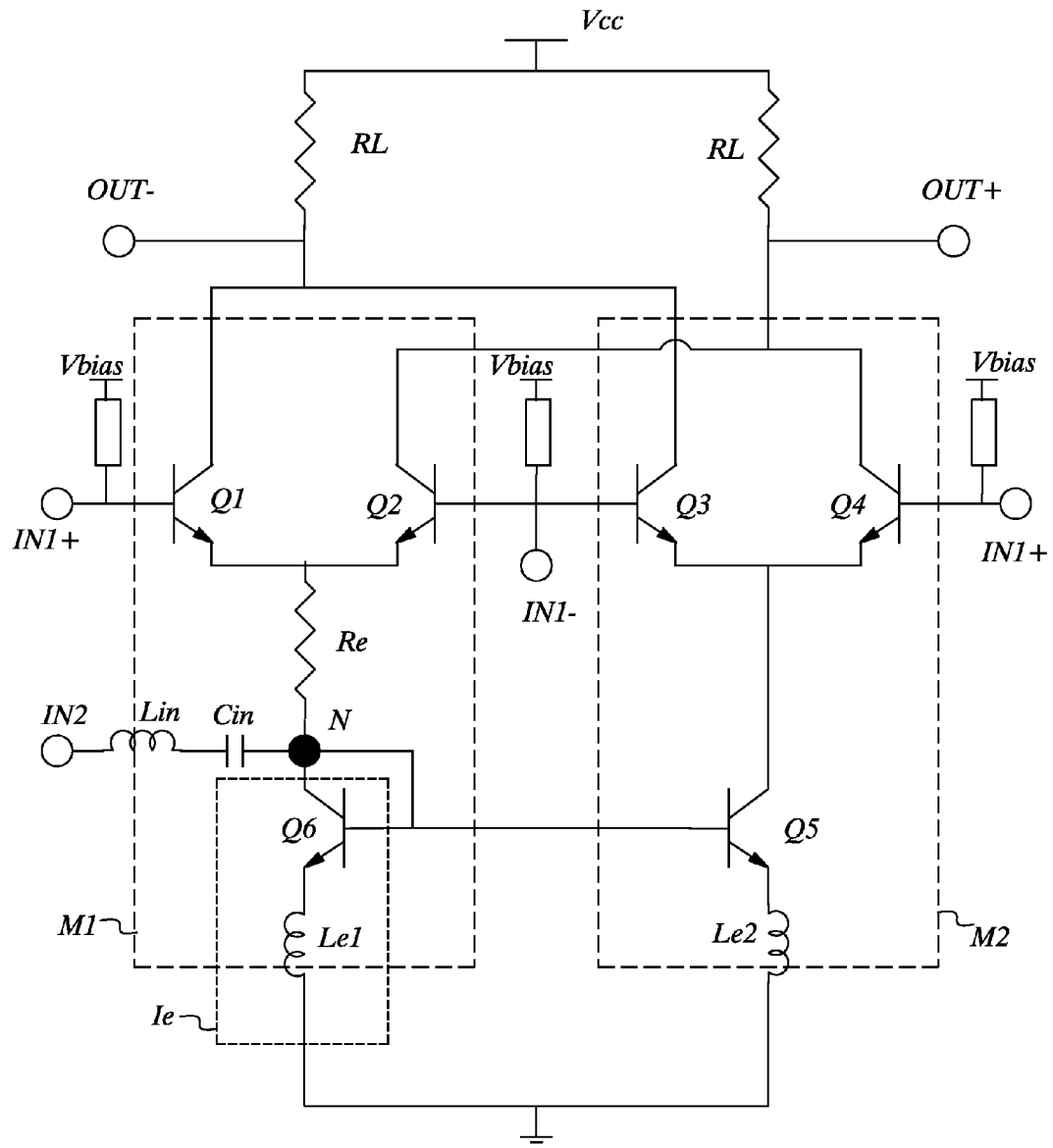
FIG. 6 illustrates another embodiment of the present invention.

According to a specific embodiment, with reference to FIG. 6, the current source k in FIG. 5 can be implemented by a sixth transistor Q6 with shorted base and collector between the node N and the base of fifth transistor Q5, and an inductor $L_e1$ connected in series between the emitter of sixth transistor Q6 and the ground. The amplitude of dc current depends on the voltage applied at the bases, as well as the ratio of device sizes of Q5 and Q6.

According to yet another specific embodiment, also with reference to FIG. 6, an inductor $L_{in}$ and a capacitor $C_{in}$ may be connected in series between the second input port IN2 and the node N to enable input impedance match for the mixer topology. Optionally the first mixer M1 may comprise a resistor Re or an inductor $L_e$ connected in series between the coupled first and second transistors and the node N. The second mixer M2 may comprise an inductor $L_e2$ coupled between the emitter of the fifth transistor Q5 and the ground, to enable ac input impedance matching.

The inductors Le1 at the emitter of Q6 and Le2 at the emitter of Q5, as well as a resistor Re are used to improve ac input impendence match. Furthermore, the inductance of Le1 is preferably larger than Le2 to steer more ac currents flowing through Q5. This can help to boost conversion gain. The inductor $L_{in}$ and capacitor $C_{in}$ at the RF input are used for input impedance matches well. The resistor Re can be replaced by an inductor. The load resistor $R_L$ can also be replaced by an inductor or a LC tank resonating preferably around the IF frequency to reduce noise figure and dc supply voltage.

A dc bias, $V_{bias}$, provides the base-emitter dc voltage for first and second transistors Q1, Q2 in the trans-conductance mixer M1, and Q5 in the Gilbert mixer M2. Such a bias arrangement can result in gain expansion of the trans-conductance mixer as the input RF power increases. This gain expansion compensates the gain compression of the Gilbert mixer, and consequently, improves the linearity of the whole mixer.

Figure 7:
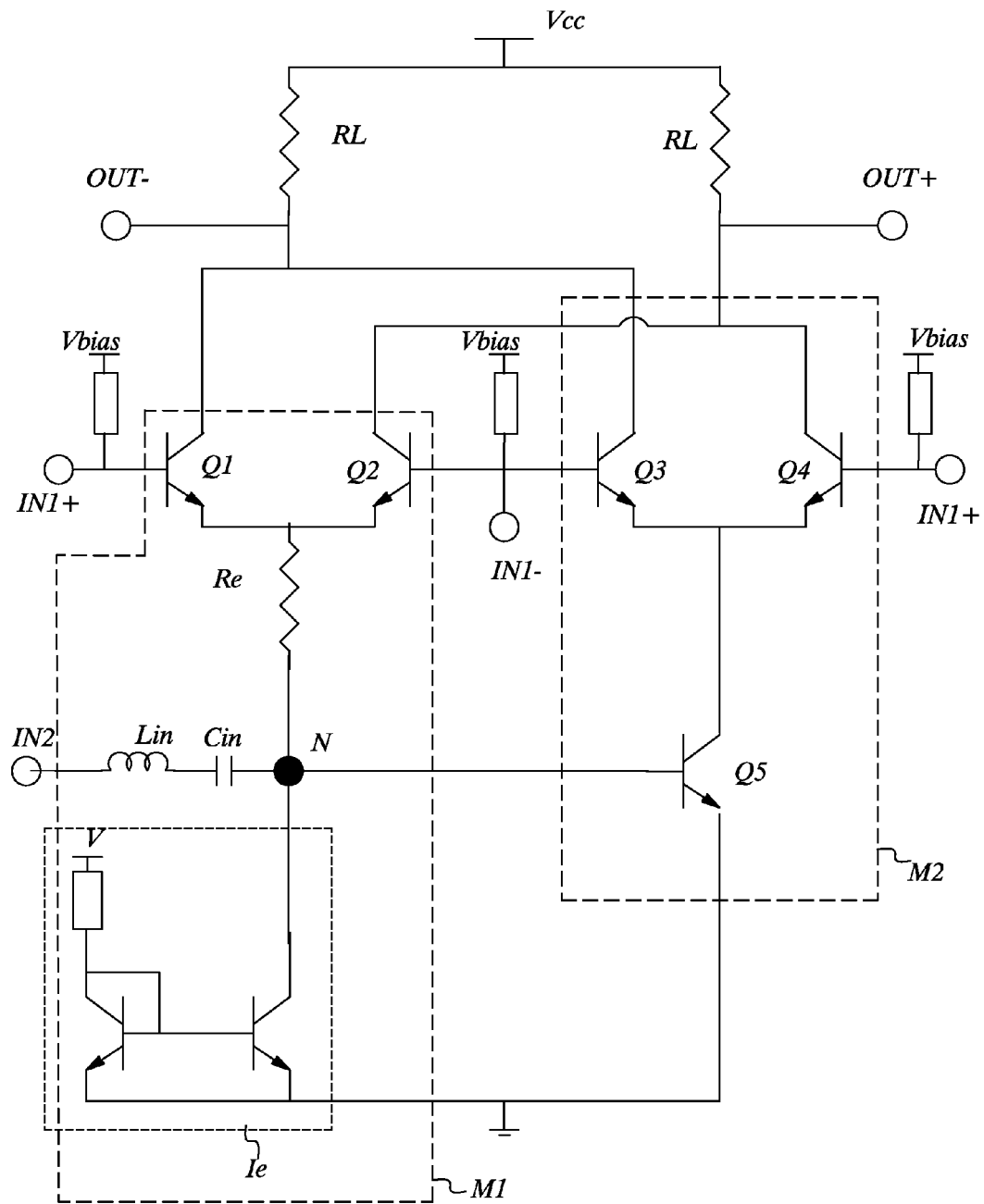
FIG. 7 illustrates a further embodiment of the present invention.

According to a further embodiment, with reference to FIG. 7, the current source $I_e$ may comprise a current mirror connected between the node N and the ground.

The fundamental difference between the implementation shown in FIG. 6 and the micromixer shown in FIG. 4 lays in the fact that transistor Q3 in FIG. 4, which plays a crucial role in micromixer, is removed from the invented mixer. The transistor Q3 is inevitable and necessary in micromixer in order to convert a single-ended RF voltage signal to differential current signals. Moreover, the emitter-coupled pair of Q1 and Q2 in micromixer function as a switch core controlled by LO signal, instead of the trans-conductance mixer proposed in this invention. The combination of M1 and M2 makes use of the gain advantage of the Gilbert mixer and of the linearity and noise advantage of the trans-conductance mixer whose linearity is further boosted by the specific bias relationship between M1 and M2 in the proposed topology, as described below.

Advantages of the invention comprise.

Linearity improvement is achieved by compensating the gain compression of Gilbert mixer with a parallel-connected trans-conductance mixer.

As input RF power is increased, the dc base-emitter voltages of Q5, $V_{be,Q5}$, decreases, giving rise to gain compression of the Gilbert mixer. Since M1 and M2 are arranged such that they are dc-coupled at the second input port IN2, the dc base-emitter voltage drop of Q5 results in an increase of the dc base-emitter voltage of Q1 and Q2, $V_{be,Q1/Q2}$, because the sum of $V_{be,Q1/Q2}$ and $V_{be,Q5}$ is $V_{bias}$, a constant. The increase of $V_{be,Q1/Q2}$ gives rise to an increase of conversion gain of the trans-conductance mixer. This compensates the gain compression of Gilbert mixer and extends the linear region of the whole mixer. The appendix explains why the conversion gain of the trans-conductance mixer increases with the dc base-emitter voltage.

Additionally the present implementation shown in FIG. 6 should have lower noise figure than micromixer, since one noise source, the transistor Q3 in common-base configuration (see FIG. 4), is removed. A further advantage by removing transistor Q3 is that the dc supply voltage may be reduced by an amount of roughly a diode drop.

This mixer topology can be implemented in Silicon or GaAs technology. It can be fully integrated on a chip but can also be made with discrete components or a hybrid of ICs and discrete components. This topology can be applied in both down- and up-conversion mixers.

It will be understood by those skilled in the art that various modifications and changes may be made to the present invention without departure from the scope thereof, which is defined by the appended claims.

APPENDIX

The following is a brief attempt to explain why the conversion gain of the trans-conductance mixer increases with the dc base-emitter voltage. Assuming the collect current $I_c$ is related to the base-emitter voltage $v_{be}(t)$ by $$I_c(t) = I_s exp[v_{be}(t)/V_T] \quad (1)$$

where $I_s$ is the saturation current and $V_T = kT/q$. When LO signal $v_L(t) = V_L \cos(\omega_L t)$ and RF signal $v_R(t) = V_R \cos(\omega_R t)$ are applied at the base and the emitter, respectively, and the dc bias voltage is $V_{be}$, the base-emitter voltage $v_{be}(t) = V_{be} + v_L(t) - v_R(t)$. Inserting it into (1) yields a function of the trans-conductance, which describes the relationship between input RF voltage and the collect current $$g(t) = \frac{\partial I_c}{\partial v_R}\bigg|_{v_{R=0}} = -\frac{I_s}{V_T} \exp[(V_{be} + v_L(t))/V_T] \quad (2)$$

$$= -\frac{I_s \exp(V_{be}/V_T)}{V_T} \exp\left[\frac{V_L}{V_T} \cos(\omega_L t)\right]$$

$$= \frac{I_s \exp(V_{be}/V_T)}{V_T} \left\{ I_0\left(\frac{V_L}{V_T}\right) + \sum_n 2I_n\left(\frac{V_L}{V_T}\right) \cos(n\omega_L t) \right\}$$

where $I_n(x)$ denotes the modified Bessel function of the first kind. This time varied trans-conductance g(t) multiplied by the $v_R(t)$ generates desired frequency component at the collector current, $$I_c(t) = g(t) \cdot v_R(t) \quad (3)$$

$$= -\frac{I_s \exp(V_{be}/V_T)V_R}{V_T} \left\{ I_0\left(\frac{V_L}{V_T}\right) + \sum_n 2I_n\left(\frac{V_L}{V_T}\right) \cos(n\omega_L t) \right\} \cdot \cos(\omega_R t)$$

Only the intensity of the component $(\omega_L \pm \omega_R)t$ is associated with the conversion gain, $$\text{Conversion Gain} \propto I_C[(\omega_L \pm \omega_L)t] = \frac{2I_s \exp(V_{be}/V_T)V_R}{V_T} I_1\left(\frac{V_L}{V_T}\right) \quad (4)$$

Eq. (4) indicates that the conversion gain of the trans-conductance mixer is exponentially proportion to the dc base-emitter voltage.

REFERENCES

[1] T. H. Lee, *The design of CMOS radio-frequency integrated circuits*, pp. 319-325, Cambridge University Press, 1998.

[2] M. Bao, Y. Li, and A. Cathelin, "*A 23 GHz active mixer with diode linearizer in SiGe BiCMOS technology*", Proc. of 33rd European Microwave Conference, pp. 391-393, 2003.

[3] B. Gilbert, "*The MICROMIXER: A highly linear variant of the Gilbert mixer using a bisymmetric class-AB input stage*", IEEE J. Solid-State Circuits, vol. 32, pp. 1412-1423, September 1997.

[4] B. Gilbert, "*RF mixer with inductive degeneration*", U.S. Pat. No. 6,122,497, Sep. 19, 2000.

What is claimed is:

1. A combination mixer arrangement comprising:
   first and second input ports for receiving local oscillator (LO) and radio frequency (RF) input signals, respectively, and an output port for providing intermediate frequency (IF) output signals;
   a first mixer and a second mixer coupled in parallel between said LO and RF input and IF output ports; and
   wherein said first mixer and second mixer are arranged to be driven simultaneously by an input signal provided at said second input port (RF); and
   wherein said first mixer and second mixer are dc-coupled by applying a single DC bias voltage ($V_{bias}$) to the first mixer and second mixer via said first input port (LO) to enable gain expansion of first mixer responsive to an increase in said input signal and thereby an improved linearity for the combination mixer arrangement.

2. The combination mixer arrangement according to claim 1, wherein said first mixer is a single balanced trans-conductance mixer, and said second mixer is a single balanced Gilbert mixer.

3. The combination mixer arrangement according to claim 1, wherein said first mixer comprises a first transistor (Q1) coupled to a first terminal of said output port (IF), and to a first terminal of said first input port (LO), and further comprising a second transistor (Q2) coupled to a second terminal of said output port (IF), and to a second terminal of said first input port (LO), wherein said first and second transistors (Q1, Q2) are coupled together and to a node coupled to said second input port (RF), and further comprising a current source ($I_e$) connected between said node and an electrical ground.

4. The combination mixer arrangement according to claim 3, wherein said second mixer comprises a third transistor (Q3) coupled to said first terminal of said output port (IF), and to said second terminal of said first input port (LO), and a fourth transistor (Q4) coupled to said second terminal of said output port (IF), and to said first terminal of said first input port (LO), and wherein said third and fourth transistors (Q3, Q4) are coupled together and to a fifth transistor (Q5), and said fifth transistor (Q5) is coupled to said second input port (RF) via said node and to said ground.

5. The combination mixer arrangement according to claim 3, wherein said current source ($I_e$) comprises a sixth transistor (Q6) coupled between said node and said fifth transistor (Q5), and an inductor coupled between said sixth transistor (Q6) and said ground.

6. The combination mixer arrangement according to claim 1, wherein inductor ($L_{in}$) and a capacitance ($C_{in}$) are connected in series between said second input port (RF) and said node to enable input impedance match.

7. The combination mixer arrangement according to claim 5, wherein said first mixer further comprises a resistor or an inductor coupled between said coupled first and second transistors (Q1, Q2) and said node, and said second mixer further comprises an inductor coupled between the fifth transistor (Q5) and said ground, thereby providing ac input impedance match.

8. The combination mixer arrangement according to claim 5, wherein said current source ($I_e$) comprises a current mirror coupled between said node and said ground.

9. The combination mixer arrangement according to claim 1, wherein said first input port receives local oscillator input signals, and said second input port receives a radio frequency input signal.

* * * * *